(12) United States Patent
Roseen, Jr. et al.

(10) Patent No.: US 7,524,388 B2
(45) Date of Patent: Apr. 28, 2009

(54) COMPOSITES, METHOD OF MANUFACTURE THEREOF, AND ARTICLES FORMED THEREFROM

(75) Inventors: E. Clifford Roseen, Jr., Warwick, RI (US); Murali Sethumadhavan, Shrewsbury, MA (US)

(73) Assignee: World Properties, Inc., Lincolnwood, IL (US)

( * ) Notice: Subject to any disclaimer, the term of this patent is extended or adjusted under 35 U.S.C. 154(b) by 121 days.

(21) Appl. No.: 11/382,513

(22) Filed: May 10, 2006

(65) Prior Publication Data

US 2006/0258241 A1 Nov. 16, 2006

Related U.S. Application Data

(60) Provisional application No. 60/679,638, filed on May 10, 2005.

(51) Int. Cl.
*B29C 53/58* (2006.01)
*B29C 70/34* (2006.01)
*B31C 1/00* (2006.01)
*B65H 81/00* (2006.01)

(52) U.S. Cl. .................... 156/171; 156/184; 156/191; 156/285; 156/286; 156/296; 428/901

(58) Field of Classification Search ............... 156/171, 156/184, 285, 286, 296, 307.1, 307.3; 174/258, 174/259; 257/702; 408/297.4, 298.1, 299.7, 408/300.7, 301.1, 301.4, 304.4, 306.6, 308.4, 408/311.11, 311.51, 361, 364, 365, 375, 408/396, 901
See application file for complete search history.

(56) References Cited

U.S. PATENT DOCUMENTS

| | | | |
|---|---|---|---|
| 3,240,662 A | 3/1966 | Smyers et al. | |
| 3,526,568 A | 9/1970 | Kepple et al. | |
| 3,558,423 A | 1/1971 | Rossetti, Jr. | |
| 3,767,500 A * | 10/1973 | Tally et al. | 156/184 |
| 4,087,300 A * | 5/1978 | Adler | 156/184 |
| 4,268,339 A | 5/1981 | Urban | |
| 4,394,498 A | 7/1983 | Kastelic | |
| 4,737,398 A | 4/1988 | Ikenaga et al. | |
| 4,802,061 A | 1/1989 | Portugall et al. | |
| 4,871,595 A | 10/1989 | Lusignea et al. | |
| 4,876,120 A | 10/1989 | Belke et al. | |
| 4,963,428 A | 10/1990 | Harvey et al. | |
| 4,966,806 A | 10/1990 | Lusignea et al. | |
| 4,966,807 A | 10/1990 | Harvey et al. | |
| 4,975,312 A | 12/1990 | Lusignea et al. | |
| 4,994,316 A * | 2/1991 | Browne et al. | 428/209 |

(Continued)

FOREIGN PATENT DOCUMENTS

CA 2273542 12/1999

(Continued)

*Primary Examiner*—Jeff H Aftergut
*Assistant Examiner*—Brian R Slawski
(74) *Attorney, Agent, or Firm*—Cantor Colburn LLP

(57) ABSTRACT

A method of forming a dielectric substrate comprises contacting a liquid crystalline polymer fibrous web having a thickness of 5 mils (127 micrometers) or less with a resin composition to form a dielectric composite. Contacting is carried out under vacuum, followed by pressure. The dielectric substrate is useful in circuit materials, circuits, and multilayer circuits, economical to make, and has excellent dielectric strength.

15 Claims, 1 Drawing Sheet

U.S. PATENT DOCUMENTS

| | | | |
|---|---|---|---|
| 5,037,691 A * | 8/1991 | Medney et al. | 428/137 |
| 5,147,967 A | 9/1992 | Stern et al. | |
| 5,164,458 A | 11/1992 | Jennings et al. | |
| 5,216,092 A | 6/1993 | Huspeni et al. | |
| 5,288,529 A | 2/1994 | Harvey et al. | |
| 5,360,647 A | 11/1994 | Sumida | |
| 5,529,740 A | 6/1996 | Jester et al. | |
| 5,545,475 A | 8/1996 | Korleski | |
| 5,703,202 A | 12/1997 | Jester et al. | |
| 5,719,354 A | 2/1998 | Jester et al. | |
| 5,900,292 A | 5/1999 | Moriya | |
| 6,538,211 B2 | 3/2003 | St. Lawrence et al. | |
| 6,602,583 B2 | 8/2003 | St. Lawrence et al. | |
| 6,645,630 B1 * | 11/2003 | Nakamura et al. | 428/413 |
| 2003/0024110 A1 * | 2/2003 | Fujii et al. | 29/829 |
| 2003/0087077 A1 * | 5/2003 | Samuels et al. | 428/292.1 |

FOREIGN PATENT DOCUMENTS

| | | |
|---|---|---|
| JP | 2001244630 | 9/2001 |

* cited by examiner

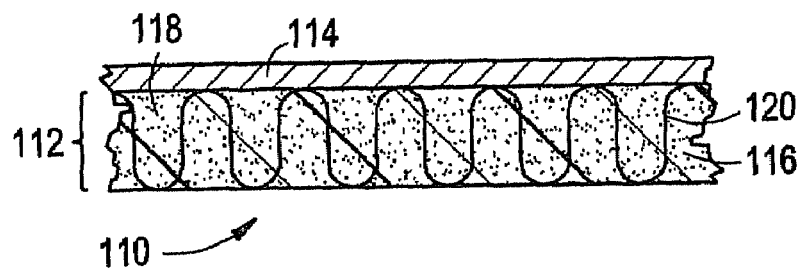
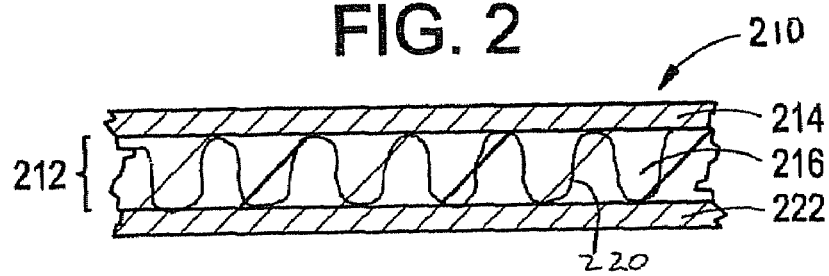
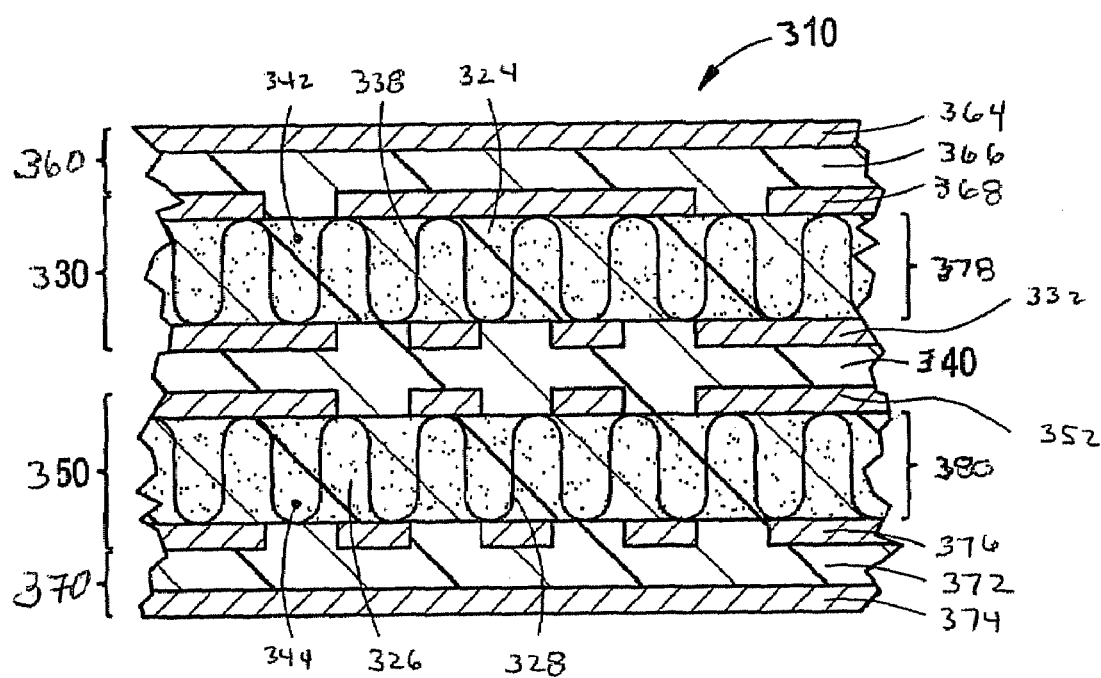

COMPOSITES, METHOD OF MANUFACTURE THEREOF, AND ARTICLES FORMED THEREFROM

CROSS-REFERENCE TO RELATED APPLICATION

This application claims the benefit of U.S. Provisional Application Ser. No. 60/679,638 filed on May 10, 2005, which is incorporated by reference herein in its entirety.

BACKGROUND

This invention relates to composites and in particular to composites useful as thin dielectric substrates in circuit materials, circuits, and multi-layer circuits.

As used herein, a circuit material is an article used in the manufacture of circuits and multilayer circuits, and includes circuit laminates, bond plies, conductive layers, resin coated conductive layers, and cover films. Such circuit materials comprise dielectric materials formed from a thermosetting or thermoplastic polymer. The dielectric material in a bond ply, resin covered conductive layer, or cover film can comprise a substantially flowable dielectric material, i.e., one that softens or flows during manufacture but not use of the circuit. The dielectric material in a circuit laminate (i.e., a dielectric substrate) is, in contrast, a non-flowable material that is designed to not soften or flow during manufacture or use of the circuit or multi-layer circuit.

Circuit laminates further have a conductive layer fixedly attached to a dielectric substrate layer. When a second conductive layer is disposed on the other side of the dielectric layer, the material is often referred to as a double clad circuit laminate. Patterning a conductive layer of a circuit laminate, for example by etching, provides a circuit, or in the case of a double clad circuit laminate, a double clad circuit. One or both of the conductive layers of a double clad laminate can be processed to provide circuit layers.

The aforementioned circuit materials and circuits can be combined in various configurations to provide multilayer circuits. "Multilayer circuits" as used herein refers to materials having at least two dielectric layers and at least two conductive layers, wherein at least one of the conductive layers is circuitized, and is inclusive of both subassemblies used to form finished circuits and the finished circuits themselves.

In one simple form, a multilayer circuit includes a double clad circuit and a resin coated conductive layer, wherein the dielectric material of the resin coated conductive layer is disposed on a circuit layer of the double clad circuit. In another simple form, a multilayer circuit includes a first circuit and a second circuit joined by a bond ply disposed between the circuit layer of the first circuit and the dielectric substrate of the second circuit. Typically, such multilayer circuits are formed by laminating the circuit(s) and/or circuit material(s) in proper alignment using heat and/or pressure. Bond plies can be used to provide adhesion between circuits and/or between a circuit and a conductive layer, or between two conductive layers. In place of a conductive layer bonded to a circuit with a bond ply, the multilayer circuit can include a resin coated conductive layer bonded directly to the outer layer of a circuit. In such multilayer structures, after lamination, known hole forming and plating technologies can be used to produce useful electrical pathways between conductive layers.

Circuits and circuit materials are typically divided into two classes, flexible and rigid. Flexible circuit materials generally tend to be thinner and more bendable than the so-called rigid materials. These rigid materials have a lesser degree of bendability, and the dielectric materials used to produce rigid circuit substrates typically comprise a fibrous web or other forms of reinforcement. Suitable fibrous web reinforcement can be composed of glass fibers, or alternatively, of polymeric fibers having good dielectric properties, such as aromatic polyamides ("aramids").

While there are a variety of rigid circuit materials available today, for example FR4 epoxy glass laminates, and the like, there is a growing demand for rigid circuit materials for high performance (high frequency) applications, that is, applications operating at 1 gigahertz (GHz) or higher. High performance applications require, among other things, circuit materials having low dielectric constants for low propagation delay, lower cross talk and higher clock rates, low dissipation factor (Df) for low attenuation, better signal integrity, and lower power consumption in portables. Use of glass or aramid reinforcement materials in dielectric substrates have certain disadvantages in high performance applications. For example, glass-based dielectric substrates such as FR-4 have a relatively high dielectric constant (Dk) of 4.2 to 4.5, measured at 1 GHz). Aramid-based dielectric substrates have a relatively high moisture absorbance, which can lead to both variable dielectric constants and high dielectric loss (dissipation factor) properties in the dielectric substrate.

As the complexity of multilayer circuits increases, there is also incentive to reduce the thickness of the dielectric layers of the multilayer circuits. Thinner dielectric layers enable the addition of more layers of circuitry, keep the weight and dimensions of the circuit boards as low as possible, and allow addition of more interconnect circuitry to be incorporated into a single board. It is difficult, however, to achieve thinner dielectric layers and still maintain good mechanical and electrical properties. Very thin fibrous webs (less than or equal to 4 mils (100 micrometers)) are more prone to dimensional distortion when placed under mechanical stresses, for example the stresses associated with the manufacture of reinforced prepregs and circuit laminates. The steps of impregnating the web, curing, heating, pressing, rolling, laminating, cutting, and the like can result in dimensional distortion in the x-y plane, thinning (which results in non-uniform thickness), and even tearing. Non-woven fibrous webs are especially prone to these defects.

What is needed, therefore, is a method for the manufacture of dielectric substrates having thin (100 micrometers or less) woven or non-woven fibrous web materials incorporated therein that does not suffer from the disadvantages described above. It would also be useful if the method produced dielectric substrates having good mechanical and electrical properties, such as low moisture absorbance, low coefficients of thermal expansion (CTE) in all directions, low dielectric and dissipation factors, and/or non-flammability.

SUMMARY

The above discussed and other drawbacks and deficiencies of the prior art circuit materials can be overcome or alleviated by a method of forming a composite, comprising contacting a liquid crystalline polymer fibrous web having interfiber spaces and a thickness of less than or equal to about 5 mils (127 micrometers) with a resin composition that is substantially free of a solvent, in the presence of a vacuum effective to infiltrate the fibrous web with the resin composition; and removing the vacuum to provide an impregnated liquid crystalline polymer fibrous web.

Dielectric substrates, circuit materials, circuits, and multi-layer circuits comprising the impregnated web prepared by this method are also disclosed.

The features and advantages of the present invention will be appreciated and understood by those skilled in the art from the following detailed description and drawings.

BRIEF DESCRIPTION OF THE DRAWINGS

Referring now to the exemplary drawings wherein like elements are numbered alike in the several FIGURES:

FIG. 1 is a schematic representation of an exemplary circuit material comprising a resin-impregnated liquid crystalline polymer fibrous web and a conductive layer;

FIG. 2 is a schematic representation of a double clad circuit laminate; and

FIG. 3 is a schematic representation of an exemplary multilayer circuit.

DETAILED DESCRIPTION

It has been found by the inventors hereof that very thin dielectric substrates can be efficiently and economically produced using vacuum-pressure impregnation (VPI) of liquid crystalline polymer fibrous webs with a solventless resin. In VPI, a porous substrate is impregnated with a resin by contacting the substrate with the resin first under vacuum, and then under pressure. It has unexpectedly been found that VPI can be used to produce thin dielectric substrates without significant dimensional distortion using this method. Because the method is solventless, the manufacturing process is more efficient, less harmful to the environment, and less costly. Furthermore, because a liquid crystalline polymer fibrous web is used, the substrates can have excellent properties, for example low water absorption, low CTE, low dielectric constant, and/or low dissipation factor. In a particularly advantageous feature, such substrates can be prepared essentially free of voids.

The dielectric substrates comprise a liquid crystalline polymer fibrous web impregnated with a resin composition. The fibrous webs can be in the form of woven or non-woven sheets, for example a woven fabric. Suitable liquid crystalline polymers for forming the fibers of the webs can withstand the processing conditions used in the manufacture of circuit materials and circuits, and preferably do not significantly adversely affect the dielectric or other properties of the dielectric substrate, for example, flame retardance, moisture absorption, dimensional stability, and the like. A specific liquid crystalline polymer non-woven fibrous web is commercially available from Kuraray America Inc., New York, N.Y., under the trade name VECRUS. Suitable liquid crystalline polymer webs are described in U.S. Pat. No. 6,229,096, which is incorporated herein by reference in its entirety. The webs described therein comprise liquid crystalline fibers and a binder, wherein the fiber-binder combination is provided with sufficient porosity to allow infiltration of a resin composition.

Resins suitable for forming dielectric substrates by VPI are flowable during VPI in the absence of a solvent. Use of a solvent increases manufacturing costs, increases enviromnental compliance requirements, and increases the disposal costs. The need to remove the solvent after impregnation of the fibrous web also increases manufacturing time, and can increase costs if heating is used. In addition, defects in the product can arise from uneven solvent evaporation. Solventless impregnation of liquid crystalline polymer fibrous webs is therefore a significant advance in the art. Specifically, the resin composition has less than about 5 wt. %, specifically less than about 2 wt. %, more specifically less than about 1 wt. %, and still more specifically less than about 0.5 wt. % solvent present, where a solvent is defined as a compound having a boiling point of less than about 200° C. at atmospheric pressure. In a specific embodiment, essentially no solvent is present.

The flowable resins accordingly have viscosities, under the desired VPI processing conditions, of about 100 to about 1200 mPa·s, measured at 25° C., specifically about 300 to about 1000 mPa·s. The viscosity of the resin is further selected so as to provide flowability under VPI processing conditions when additives such as particulate fillers, flame retardants, curing agents, and the like are present.

Either thermosetting or thermoplastic resins can be used, or a combination thereof. Suitable thermosetting resin compositions are preferably flowable prior to cure, and substantially non-flowable after cure. Thus, suitable thermosetting resin compositions comprise a material having a viscosity effective to allow flow into interfiber spaces within a fibrous web during VPI, and sufficient curability to form a solid dielectric substrate material. Specific useful polymers include polyenes such as polybutadiene, polybutadiene copolymers, polyisoprene, polyisoprene copolymers, and polybutadiene-polyisoprene copolymers; epoxy resins; polyesters, such as those available under trade names DOLPHON, SYNTHITE, DOLFEX, and HI-THERM, from John C. Dolph Co., Monmouth Junction, N.J.; polyimides; silicones, such as those available from Wacker; bismaleimide triazine (BT) resins, benzoxazines, polystyrenes, poly(alkyl methacrylate)s, poly(alkyl acrylate)s, poly(arylene ether)s, polyaryletherketones and the like, and combinations comprising at least one of the foregoing polymers.

One type of thermosetting resin is a thermosetting polybutadiene and/or polyisoprene resin. As used herein, the term "thermosetting polybutadiene and/or polyisoprene resin" includes homopolymers and copolymers comprising units derived from butadiene, isoprene, or mixtures thereof. Units derived from other copolymerizable monomers can also be present in the resin, for example in the form of grafts. Exemplary copolymerizable monomers include but are not limited to vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetrachlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting polybutadiene and/or polyisoprene resin include but are not limited to butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins can also be modified, for example the resins can be hydroxyl-terminated, methacrylate-terminated, carboxylate-terminated resins. Post-reacted resins can be used, such as such as epoxy-, maleic anhydride-, or urethane-modified butadiene or isoprene resins. The resins can also be crosslinked, for example by divinylaromatic compounds such as divinyl benzene, e.g., a polybutadiene-styrene crosslinked with divinyl benzene. Suitable resins are broadly classified as "polybutadienes" by their manufacturers, for example Nippon Soda Co., Tokyo, Japan, and Sartomer Company Inc., Exton, Pa. Mixtures of resins can also be used, for example, a mixture of a polybutadiene homopolymer and a poly(butadiene-isoprene) copolymer. Combinations comprising a syndiotactic polybutadiene can also be used.

The thermosetting polybutadiene and/or polyisoprene resin can be liquid or solid at room temperature, with liquid resins preferred, in order to provide a viscosity suitable for VPI. Suitable liquid resins can have a number average molecular weight greater than about 5,000, but generally have a number average molecular weight of less than about 5,000 (most preferably about 1,000 to about 3,000). Thermosetting polybutadiene and/or polyisoprene resins having at least 90 weight percent (wt. %) 1,2 addition are preferred because they exhibit the greatest crosslink density upon cure, due to the large number of pendent vinyl groups available for crosslinking. The polybutadiene and/or polyisoprene resin is present in the resin system in an amount of up to about 60 wt. % with respect to the total resin system, more specifically about 10 to about 55 wt. %, even more specifically about 15 to about 55 wt. %.

Other polymers that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene, for example an EPM copolymer (i.e., copolymers of ethylene and propylene monomers), or EPDM terpolymer (i.e., terpolymers of ethylene, propylene, and diene monomers). Liquid ethylene propylene diene terpolymer rubbers in which the diene is dicyclopentadiene are preferred. The molecular weights of the ethylene propylene rubbers are less than 10,000 viscosity average molecular weight. Suitable ethylene propylene rubbers include an ethylene propylene rubber having a viscosity average molecular weight (MV) of about 7,200, which is available from Uniroyal Chemical Co., Middlebury, Conn., under the trade name Trilene CP80; a liquid ethylene propylene dicyclopentadiene terpolymer rubbers having a molecular weight of about 7,000, which is available from Uniroyal Chemical Co. under the trade name of Trilene 65; and a liquid ethylene propylene ethylidene norbornene terpolymer, having a molecular weight of about 7,500, available from Uniroyal Chemical Co. under the name Trilene 67. The ethylene propylene rubber is preferably present in an amount effective to maintain the stability of the properties of the substrate material over time, in particular the dielectric strength and mechanical properties. Typically, such amounts are up to about 20 wt. % with respect to the total weight of the resin system, more specifically about 4 to about 20 wt. %, even more specifically about 6 to about 12 wt. %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. The elastomer is preferably a solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name Vector 8508M, from Enichem Elastomers America, Houston, Tex., under the trade name Sol-T-6302, and those from Fina Oil and Chemical Company, Dallas, Tex., under the trade name Finaprene 401; styrene-butadiene diblock copolymers; and mixed triblock and diblock copolymers containing styrene and butadiene, for example those available from Shell Chemical Corporation, Houston, Tex., under the trade name Kraton D1118X. Kraton D1118X is a mixed diblock/triblock styrene and butadiene containing copolymer, containing 30 vol. % styrene. The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is Kraton GX1855 (commercially available from Shell Chemical Corp.), which is believed to be a mixture of a styrene-high 1,2-butadiene-styrene block copolymer and a styrene-(ethylene-propylene)-styrene block copolymer. Typically, the unsaturated polybutadiene- or polyisoprene-containing elastomer component is present in the resin system in an amount of about 10 to about 60 wt. % with respect to the total resin system, more specifically about 20 to about 50 wt. %, or even more specifically about 25 to about 40 wt. %.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 vol. % of the total resin system.

Free radical-curable monomers can also be added for specific property or processing modifications, for example to increase the crosslink density of the resin system after cure. Exemplary monomers that can be suitable crosslinking agents include, for example, di, tri-, or higher ethylenically unsaturated monomers such as divinyl benzene, triallyl cyanurate, diallyl phthalate, and multifunctional acrylate monomers (e.g., Sartomer resins available from Arco Specialty Chemicals Co., Newtown Square, Pa.), or combinations thereof, all of which are commercially available. The crosslinking agent, when used, is present in resin system in an amount of up to about 20 vol. %, based on the total weight of the resin.

A curing agent can be added to the resin system to accelerate the curing reaction of the polyenes having olefinic reactive sites, for example an organic peroxide such as dicumyl peroxide, t-butyl perbenzoate, 2,5-dimethyl-2,5-di(t-butyl peroxy)hexane, α,α-di-bis(t-butyl peroxy)diisopropylbenzene, and 2,5-dimethyl-2,5-di(t-butyl peroxy)hexyne-3, all of which are commercially available. They can be used alone or in combination. Typical amounts of curing agent are from about 1.5 wt. % to about 10 wt. % of the total resin composition.

Other useful thermosetting resins are low molecular weight epoxy resins. Suitable epoxy resins can have weight averaged molecular weights (Mw) of about 2,000 to about 100,000, specifically about 3,000 to about 50,000, as measured, for example, by gel permeation chromatography (GPC); an epoxy equivalent weight (i.e., number averaged molecular weight per one epoxy) of from about 170 to about 2,000; and a melting point below about 140° C. Combinations of epoxy resins can be used.

Specific examples of epoxy resins include epoxidized esters of polyethylenically unsaturated monocarboxylic acids, epoxidized esters of unsaturated monohydric alcohols and polycarboxylic acids, such as, for example, bis-(2,3-epoxybutyl)adipate, bis-(2,3-epxoybutyl)oxalate, bis-(2,3-epoxyhexyl)succinate, bis-(3,4-epoxybutyl)maleate, bis-(2,3-epoxyoctyl)pimelate, bis-(2,3-epoxybutyl)phthalate, bis-(2,3-epoxyoctyl)tetrahydrophthalate, bis-(4,5-epoxydodecyl)maleate, bis-(2,3-epoxybutyl)terephthalate, bis-(2,3-epoxypentyl)thiodipropionate, bis-(5,6-epoxytetradecyl)diphenyldicarboxylate, bis-(3,4-epoxyheptyl)sulfonyldibutyrate, tris-(2,3-epoxybutyl)-1,2,4-butanetricarboxylate, bis-(5,6-epoxypentadecyl)tartrate, bis-(4,5-epxoytetradecyl)maleate, bis-(2,3-epoxybutyl)azelate, bis-(3,4-epoxybutyl)citrate, bis-(5,6-epoxyoctyl)cyclohexane-1,2-dicarboxylate, and bis-(4,5-epoxyoctadecyl)malonate; epoxidized esters of unsaturated alcohols and unsaturated carboxylic acids, such as 2,3-epoxybutyl-3,4-epoxypentanoate, 3,4-epoxyhexyl, 3,4-epoxypentanoate, 3,4-epoxycyclohexyl-3,4-epoxycyclohexanoate, 3,4-epoxycyclohexyl-4,5-epoxyoctanoate, and 2,3-epoxycyclohexylmethyl epoxycyclohexane carboxylate; epoxidized derivatives of polyethylenically unsaturated polycarboxylic acids, such as dimethyl-8,9,12,13-diepoxyeicosanedioate, dibutyl-7,8,11,12-diepoxyoctadecanedioate, dioctyl-10,11-diethyl-8,9,12,13-diepoxyeicosanedioate, dihexyl-6,7,10,11-diepoxyhexadecanedioate, didecyl-9-epoxy-ethyl-10,11-epoxyoctadecanedioate, dibutyl-3-butyl-3,4,5,6-diepoxycyclohexane-1,2-dicarboxylate, dicyclohexyl-3,4,5,6-diepoxycyclohexane-1,2-dicarboxylate, dibenzyl-1,2,4,5-diepoxycyclohexane-1,2-dicarboxylate, and diethyl-5,6,10,11-diepoxyoctadecyl succinate; epoxidized polyesters obtained by reacting an unsaturated polyhydric alcohol and/or unsaturated polycarboxylic acid or anhydride groups, such as for example, the polyester obtained by reacting 8,9,12,13-eicosanedienedioic acid with ethylene glycol, the polyester obtained by reacting diethylene glycol with 2-cyclohexene-1,4-dicarboxylic acid and the like, and mixtures thereof; and epoxidized polyethylenically unsaturated hydrocarbons, such as epoxidized 2,2-bis(2-cyclohexenyl)propane, epoxidized vinyl cyclohexene and epoxidized dimer of cyclopentadiene.

Epoxidized polymers and copolymers of diolefins, such as butadiene, can also be useful. Examples of these include epoxidized unsaturated butadiene-acrylonitrile copolymers (nitrile rubbers), epoxidized unsaturated butadiene-styrene copolymers, and the like.

Other useful epoxy resins include the glycidyl ethers and particularly the glycidyl ethers of polyhydric phenols and polyhydric alcohols. The glycidyl ethers of polyhydric phenols are obtained by reacting epichlorohydrin with the desired polyhydric phenols in the presence of alkali. Others include the polyglycidyl ether of 1,1,2,2-tetrakis-(4-hydroxyphenyl)ethane (with a melting point of 85 C), the polyglycidyl ether of 1,1,5,5-tetrakis-(hydroxyphenyl)pentane, and the like, and mixtures thereof. Further examples include the glycidylated novolacs obtained by reacting epichlorohydrin with the phenolic novolac resins obtained by the condensation of fonnaldehyde with a molar excess of a hydroxyaromatic compound such as phenol or cresol.

Suitable curing agents for epoxy resins include, for example, amines such as imidazole, aniline, ethanolamine, diethanolamine, triethanolamine, pyridine, and the like. These amines can be present as free amines or as their acid salts, where suitable acids include mineral acids such as hydrochloric, sulfuric, nitric acids, and the like; organosulfonic acids such as toluenesulfonic, methanesulfonic, trifluoromethanesulfonic acids, and the like; and carboxylic acids such as formic, acetic, propionic, cyclohexanecarboxylic, benzoic, adipic, malonic, maleic, fumaric acids and the like. Combinations of the foregoing can be used. Anhydrides can also be used, such as maleic anhydride, itaconic anhydride, benzoic acid anhydride, acetic anhydride, adipic anhydride, combinations thereof, and the like.

Suitable thermosetting silicone compositions include those curable in the presence of a transition metal catalyst such as platinum. These compositions generally comprise a crosslinkable vinyl-terminated silicone component and a hydride-terminated silicon-containing component. The silicones can be substituted with methyl, methoxy, trifluoromethyl, trifluoromethoxy, phenyl, and/or phenoxy groups. The composition can contain a cure retardant in order to retard cure until after impregnation of the LCP fibrous web.

Thermoplastic polymers can also be used in the resin composition. Suitable thermoplastic compositions will have a melting point effective to provide flowability during VPI (which can be conducted with heating) and non-flowability after VPI. Depending upon the temperature of the process, a thermoplastic resin having a melt temperature of about 150° C. or higher, specifically about 180° C. to about 400° C. can be used.

Liquid crystalline polymers (sometimes abbreviated as "LCP") are one exemplary type of thermoplastic resin, although they can also be used as thermosets by functionalization or by compounding with a thermoset such as an epoxy. Liquid crystalline polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements can be present in either the main chain (backbone) of the polymer or in the side chains. When present in the main chain or in the side chains they can be separated by more flexible molecular elements, sometimes referred to as spacers.

Liquid crystalline polymers can be blended with polymers that are not liquid crystalline polymers, hereinafter referred to as non-liquid crystalline polymers. These blends are sometimes referred to as polymer alloys, and include blends with thermosetting and thermoplastic materials. Suitable non-liquid crystalline polymers and liquid crystalline polymer components are generally mixed in a weight ratio of 10:90 to 90:10, specifically 30:70 to 70:30. Hereinafter the term liquid crystalline polymer will include such liquid crystalline polymer blends.

Both lyotropic and thermotropic liquid crystalline polymers can be useful. Suitable lyotropic liquid crystalline polymers include concentrated sulfuric acid solutions of poly(p-phenylene terephthalamide) (PPTA), silk fibroin aqueous solutions, and sericin aqueous solutions. Suitable thermotropic liquid crystalline polymers include liquid crystalline polyesters, liquid crystalline polycarbonates, liquid crystalline polyetheretherketones, liquid crystalline polyetherketoneketones, and liquid crystalline polyester imides, specific examples of which include (wholly) aromatic polyesters, polyester amides, polyamide imides, polyester carbonates, and polyazomethines. Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymers include: (a) at least one aromatic dicarboxylic acid compound, (b) at least one aromatic hydroxy carboxylic acid compound, (c) at least one aromatic diol compound, (d) at least one of an aromatic dithiol ($d_1$), an aromatic thiophenol ($d_2$), and an aromatic thiol carboxylic acid compound ($d_3$), and (e) at least one of an aromatic hydroxyamine compound and an aromatic diamine compound. The monomers can sometimes be used alone, but can frequently be used in a combination of monomers (a) and (c); (a) and (d); (a), (b) and (c); (a), (b) and (e); (a), (b), (c) and (e); or the like.

Examples of the aromatic dicarboxylic acid compound (a) include aromatic dicarboxylic acids, such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids, such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols, such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl)propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol. Examples of the aromatic thiophenol ($d_2$) include 4-mercaptophenol, 3-mercaptophenol, and 6-mercapto-phenol. Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers are prepared from monomer(s) as mentioned above by a variety of esterification methods such as melt acidolysis or slurry polymerization, or the like methods. The molecular weight of the thermotropic liquid crystalline polyester that can favorably be used can be about 2,000 to about 200,000, with about 4,000 to about 100,000 specifically useful. The measurement of the molecular weight can be, for example, by determination of the terminal groups of a compressed film thereof according to infrared spectroscopy, or by GPC.

Thermotropic liquid crystalline polymers can be used either alone or in mixture of at least two thereof. A specific thermotropic liquid crystalline polymer is 2-naphthalene carboxylic acid, 6-(acetyloxy)-polymer with 4-(acetyloxy)benzoic acid. Examples of specific commercial liquid crystalline polymers that can be used include, but are not limited to VECTRA®, commercially available from Ticona, Florence, Ky., XYDAR®, commercially available from Amoco Polymers, and ZENITE®, commercially available from DuPont, Wilmington, Del., among others.

Another type of thermoplastic resin that can be used to infiltrate the LCP fibrous web is a polyimide. Polyimides can be prepared by reacting a dianhydride with a diamine in an equimolar ratio to obtain a polyamide acid, which can form the polyimide upon further curing. The reaction can be carried out at an elevated temperature, in polar solvent suitable for dissolving the dianhydride and diamine comonomers.

Suitable dianhydrides that are useful include pyromellitic dianhydride, 2,3,6,7-naphthalene tetracarboxylic acid dianhydride, 3,3',4,4'-diphenyl tetracarboxylic acid dianhydride, 1,2,5,6-naphthalene tetracarboxylic acid dianhydride, 2,2',3,3'-diphenyl tetracarboxylic acid dianhydride, 2,2-bis(3,4-dicarboxyphenyl)propane dianhydride, bis(3,4-dicarboxyphenyl)sulfone dianhydride, 3,4,3,10-perylene tetracarboxylic acid dianhydride, bis(3,4-dicarboxyphenyl)ether dianhydride, 2,2-bis(2,3-dicarboxyphenyl)propane dianhydride, 1,1-bis(2,3-dicarboxyphenyl)ethane dianhydride, bis(3,4-dicarboxyphenyl)methane dianhydride, bis(2,3-dicarboxyphenyl)sulfone dianhydride, benzophenone tetracarboxylic acid dianhydride, and the like, and combinations comprising at least one of the foregoing. Acyclic or cyclic aliphatic dianhydrides such as cyclopentane tetracarboxylic acid dianhydride, cyclohexane tetracarboxylic acid dianhydride, butane tetracarboxylic acid dianhydride, and the like can also be suitable for use. Specific dianhydrides are pyromellitic dianhydride and benzophenone tetracarboxylic acid dianhydride.

Diamines that can be reacted with the foregoing dianhydrides to form polyimides include, for example o-, m- and p-phenylenediamine, 2,4-diaminotoluene, 1,4-diamino-2-methoxybenzene, 1,4-diamino-2-phenylbenzene, 1,3-diamino-4-chlorobenzene, 3,3'-dimethoxybenzidine, 2,4-bis (B-amino-t-butyl)toluene, 1,3-diamino-4-isopropylbenzene, m-xylenediamine, p-xylenediamine, 2,2-dimethylpropylenediamine, 1,4-cyclohexanediamine, and bis(3-aminopropyl) sulfide. Other useful polyaromatic diamines include 4,4'-diaminobiphenyl, 4,4'-diaminodiphenylmethane, 4,4'-diaminodiphenylpropane, 2,2-bis(4-aminophenyl)propane, 2,2-bis(4-aminophenyl)-1,1,1,3,3,3-hexafluoropropane, 3,4-diaminodiphenyl ether, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 4,4'-bis(3-aminophenoxy)biphenyl, 2,2-bis{4-(4-aminophenoxy)phenyl}propane, 2,2-bis{4-(4-aminophenoxy)phenyl}propane, 2,2-bis{4-(4-aminophenoxy)phenyl}-1,1,1,3,3,3-hexafluoropropane, 4,4'-diaminodiphenyl thioether, 4,4'-diaminodiphenyl sulfone, 4,4'-diaminodiphenyl ether, 2,2'-diaminobenzophenone, and 3,3'-diaminobenzophenone; naphthalene diamines such as 1,8- and 1,5-diaminonaphthalene; or heterocyclic aromatic diamines such as 2,6-diaminopyridine, 2,4-diaminopyrimidine, and 2,4-diamino-s-triazine, combinations thereof, and the like.

In addition to organic diamines, there can also be included di(aminoalkyl)polysiloxanes, or dihydroxy terminated polysiloxanes polymerizable under the present conditions, to provide polysiloxane polyimides or polysiloxane polyimideesters having reduced melt viscosities and improved melt-flow characteristics. A non-limiting example of a suitable polysiloxane diamine is alpha, omega-(3-amino-1-propyl) polydimethylsiloxane.

The reaction product of the dianhydride and the diamine is a polyamide acid of chemically combined units of a dianhydride and a diamine. A polyimide can be prepared from such a polymer by heating at a temperature of about 150° C. to about 350° C. Polyimide resins and polymers suitable for use herein have weight averaged molecular weights of about 2,000 to about 100,000, specifically about 3,000 to about 50,000, as determined by GPC. The polyimide polymers are flowable in a temperature range of interest for manufacture, specifically about 200° C. or less. A non-limiting example of a suitable commercial aromatic polyimide is KAPTON polyimide resin from General Electric Co., GE Plastics, Pittsfield, Mass.

Other types of thermoplastic resins can also be used, such as styrenes, acrylates, poly(arylene ethers), and the like, and combinations comprising at least one of the foregoing.

The resin composition can further comprise particulate fillers. Useful particulate fillers include, but are not limited to, mineral fillers such as titanium dioxide (rutile and anatase), barium titanate, strontium titanate, silica (particles and hollow spheres), including fused amorphous silica and fumed silica, corundum, wollastonite, fiberglass, $Ba_2Ti_9O_{20}$, glass spheres, quartz, boron nitride, aluminum nitride, silicon carbide, beryllia, alumina, and magnesia. The mineral fillers can be used alone or in combination. Specific mineral fillers are rutile titanium dioxide having a high dielectric constant, and amorphous silica have a low dielectric constant, thereby permitting a broad range of dielectric constants combined with a low dissipation factor to be achieved in the final product by adjusting the respective amounts of the two fillers in the composition. Organic particulate fillers can also be used, for example polyamides, including aramids; polyimides; fluoropolymers, including polytetrafluoroethylene and perfluorovinyl acetate; polyethers; polysulfides; polyolefins; and combinations comprising at least one of the foregoing types of organic polymers.

A range of filler particle sizes can be used, depending on the desired dielectric constant, the presence of other fillers, and like considerations. Suitable average particle sizes (measured using the particles longest dimension) can be from about 0.001 micrometer to about 10 micrometers. Combinations of particle sizes can also be used, for example particles having an average particle size of about 0.001 to about 0.01 micrometers, together with particles having an average particle size of about 1 to about 5 micrometers. Typically, coarse particle size of about 0.5 to about 10 micrometers can be used, or fine particle sizes of about 0.01 to about 0.1 micrometers can also be used.

To improve adhesion between the fillers and resin composition, coupling agents (e.g., silanes) can be used. It has been observed that use of coupling agents significantly improves the copper peel strength of the dielectric substrate, particularly at high temperature. This is of importance in "reworking", that is, removal and replacement of defective soldered components and devices. Poor copper peel strength at elevated temperatures can result in a damaged circuit board during rework, resulting in waste. Useful coupling agents include those capable of adhering to both the surface of the filler and the resin composition. Examples include various compounds comprising chromium, silicon, titanium, or zirconium, and mixtures comprising at least one of the foregoing compounds. A useful chromium-containing adhesion promoter is chromium (III) methacrylate/polyvinyl alcohol solution, which is used to improve bonding between thermoset resins and hydrophilic surfaces.

Useful compounds comprising titanium include, but are not limited to, monoalkoxy titanates such as tetra-n-butoxy titanium, isopropyl tri(N-ethylaminoethylamino) titanate, isopropyl tri-isostearoyl titanate and titanium di(dioctylpyrophosphate) oxyacetate; coordinate titanates such as tetraisopropyl di(dioctylphosphito)titanate; and neoalkoxy titanates such as neoalkoxy tris(dodecanoyl)benzenes sulfonyl zirconate, neoalkoxy tri(p-N-(beta-aminoethyl)aminophenyl)titanate. Other types include chelate, quaternary, and cycloheteroatom titanates. Useful compounds comprising zirconium include, but are not limited to, neoalkoxy zirconates such as neoalkoxy trisneodecanoyl zirconate, neoalkoxy tris(dodecanoyl)benzene sulfonyl zirconate, neoalkoxy tris(m-aminophenyl)zirconate, ammonium zirconium carbonate and zirconium propionate.

Useful compounds comprising silicon include a wide variety of silanes, including halosilanes, aminoalkoxysilanes, aminophenylsilanes, phenylsilanes, heterocyclic silanes, N-heterocyclic silanes, acrylic silanes, and mercapto silanes. In one embodiment, the coupling agent can be an epoxy silane, an acrylic silane, an aminosilane, a mercaptosilane, a vinyl silane, or a bis-silane. Other useful silanes include polymeric types, such as trimethoxy-, triacetoxy-, or triethoxysilyl modified poly-1,2-butadiene, or aminoalkyl silsequioxanes wherein the alkyl group has two to about 10 carbon, for example gamma-aminopropylsilsesquioxane, available under the trade name Silquest A-1106, Silquest A-1170, or Silquest A-174, from OSI Specialties, Sisterville, W. Va.

The coupling agents can be used singly or in combination. In practice, the coupling agents (in an optional solvent) are applied to the filler(s) before combination with the resin composition, although a mixture of resin composition and filler can be treated with the coupling agent. The choice of coating method is not critical and generally depends on the scale of the preparation. The amount of coupling agent applied to the filler depends on the type of agent, the type of filler, the type of resin composition, and like considerations. In general, where used, the coupling agent is applied to the filler so as to result in an amount of about 0.001 to about 10 weight percent, specifically about 0.01 to about 1.0 weight percent, of the weight of the particulate filler.

The relative amounts of LCP fibrous web, resin composition (resin and optional additives such as crosslinking agents, curing agents, flame retardants, and the like, if present), and particulate filler (if present) can vary depending on the desired properties of the dielectric substrate. In general, the dielectric substrates can comprise, based on the total weight of the substrate, about 10 to about 60 wt. %, specifically about 15 to about 45 wt. %, and more specifically about 10 to about 40 wt. % of LCP fibrous web; about 20 to about 90 wt %, specifically about 25 to about 80 wt. %, specifically about 25 to about 70 wt. %, and more specifically about 30 to about 60 wt. %, of resin composition; and 0 to about 70 wt %, specifically about 1 to about 60 wt. %, more specifically about 5 to about 50 wt. %, and even more specifically about 10 to about 45 wt. % of particulate filler.

In general, the resin composition for infiltration of the LCP fibrous web is prepared as follows. A polymer as described above and any optional components, e.g. coupling agents, crosslinkers, plasticizers, curing agents, or the like, are thoroughly mixed to form an intimate blend in conventional mixing equipment, in the absence of a solvent. While it can be possible in some instances to include particulate filler in the resin composition, filler is more typically applied as described below. The mixing temperature is regulated to avoid substantial decomposition, crosslinking, or other reaction of the components. Where thermoplastic resins are used, mixing can occur in the melt. Mixing continues until the components are uniformly dispersed throughout to form the resin composition to form a solventless resin composition.

The solventless resin composition is then used in vacuum pressure impregnation of the thin LCP fibrous web. In one embodiment, the fibrous web is disposed on a carrier for ease of handling. The carrier can also provide reinforcement to the relatively fragile fibrous web, thereby mitigating and stretching and/or tearing of the web during processing. In general, the carrier is made from a material having low adhesion to the infiltrated web. Suitable carriers can be solid or porous to an extent effective to improve the infiltration of the LCP fibrous web. The porosity should not be so great as to significantly adversely affect the removal of the impregnated web from the carrier. During VPI, the fibrous web can be in any convenient shape, i.e., a sheet, stacked sheets, or rolled, for example onto a spool. In a specific embodiment, a continuous length of LCP fibrous web and carrier is co-wound onto a spool to form a roll.

In addition to, or in lieu of, combining the particulate filler with the resin composition, particulate filler can be incorporated into the dielectric substrate by combining the particulate filler and the fibrous web prior to VPI. For example, the particulate filler can be "dusted" onto the fibrous web. The dusted-on particulate filler is then carried into the interfiber spaces of the fibrous web by the flow of the resin composition. In an embodiment, the fibrous web is contacted with particulate filler by a dusting process, the dusted fibrous web (and carrier if used) is wound onto a spool to form a roll, and the roll is contacted with the resin composition under vacuum.

The resin composition is initially contacted with the LCP fibrous web under vacuum. For example, the fibrous web can be placed in a vacuum chamber, the chamber evacuated to the desired pressure, and the resin composition introduced to the chamber under vacuum. Upon contact with the web, the resin composition flows into the interfiber spaces of the fibrous web. Alternatively, the web and the resin composition can be in contact prior to establishing a vacuum effective to impregnate the web. An effective vacuum is readily determined by one of ordinary skill in the art, based on the flowability of the resin, the time desired for impregnation, and like considerations. Suitable effective vacuum pressures can be about 0.01 (0.001 KPa) to about 700 torr (93.3 KPa), more commonly about 1 (0.133 Kpa) to about 300 torr (40 Kpa), even more specifically about 1 (0.133 Kpa) to about 100 torr (13.3 Kpa). The impregnation is continued for a length of time effective to yield the desired level of impregnation. In general, an effective time can be about 1 minute to about 60 minutes, more specifically about 10 minutes to about 30 minutes.

The resin composition can be contacted with the LCP fibrous web at any temperature, preferably at ambient temperature or an elevated temperature effective to enhance infiltration of the resin composition. Preferably the temperature is below the cure temperature and decomposition temperature of the resin. Excess cure of a thermosetting resin will adversely affect the flow properties of the resin composition during the contacting process. Suitable temperatures are readily determined by one of ordinary skill in the art, depending on the composition of the resin, the amounts and types of other components such as curing agents, catalysts, and the like, the vacuum used, the duration of the contacting process, and like considerations. Exemplary temperatures are about 30° C. to about 120° C. The temperature of the resin and the LCP web can be adjusted prior to contacting, during contacting, or both. In one embodiment, the temperature of the web is adjusted to be higher than the temperature of the resin before contacting, for example about 5° C. to about 30° C. higher.

After contacting under vacuum, the resin composition and the fibrous web are then pressurized. Such pressurization induces additional flow of the resin composition into the interfiber spaces of the fibrous web. Suitable pressures that can be used include atmospheric pressure and pressures that are in excess of atmospheric pressure, and are readily determined by one of ordinary skill in the art, based on the resin composition, the degree of vacuum used in the preceding step, the time used to complete impregnation, and like considerations. For example, a pressure of greater than about 760 torr (103 KPa), more specifically greater than about 1,520 torr (203 Kpa), specifically greater than 2,280 torr (304 Kpa), can be used to effect complete infiltration of the resin composition. There appears to be no particular upper limit to the pressures to be used, other than those dictated by cost and the equipment available. Thus, pressures as high as 76,000 torr (10,132 Kpa) can be used, although an upper limit of 7,600 torr (1,013 Kpa) are generally more practicable.

Without being bound by theory, it is believed that vacuum impregnation of the LCP fibrous web proceeds from the outside of the assemblage of fibrous web to the center, and that the vacuum created within the fibrous web provides minimal or no opportunity for the resin composition to form or entrap vapors or gases to form bubbles or voids. Maintaining the vacuum can additionally act to degas the resin composition, further preventing or minimizing void formation, especially at the resin/fiber interface. In one embodiment, the resin composition is degassed (for example, by placing under vacuum) prior to contacting the LCP fibrous web. Subsequent application of pressure further ensures complete impregnation, and minimization of voids.

Subsequent to the VPI process, any excess resin composition can be removed, for example by removing the impregnated LCP fibrous web from the chamber and/or draining the excess resin from the chamber. Residual pressure from the pressure treatment can be used to facilitate the removal of the excess resin composition. Where elevated temperature is used during VPI, for example where thermoplastic resins are used for impregnation, cooling the impregnated LCP fibrous web will preferably occur after excess resin is removed.

Where a thermosetting resin composition is used, the impregnated LCP fibrous web can be partially or fully cured. Such cure can occur at any point after pressure has been applied to complete impregnation. In one embodiment, the impregnated fibrous web is partially cured, i.e., "B-staged," after VPI, but prior to further processing. In another embodiment, the impregnated fibrous web is fully cured after VPI, but prior to further processing. Cure can be effected by exposure to radiation, e.g. UV radiation, heat, or a combination comprising at least one of these, depending on the resin and initiator type. For example, the impregnated LCP fibrous web in the form of a roll is removed from the vacuum chamber, then thermally treated in an oven or other heated environment to effect a partial or a full cure. Effective cure temperatures for many thermosetting resins can be about 200° C. to about 350° C., specifically about 220° C. to about 320° C., more specifically about 250° C. to about 280° C.

The uncured, B-staged, or fully cured impregnated LCP fibrous web can be subjected to a variety of processing steps known for the production of circuit materials. Other layers can be added to the impregnated web, for example using by lamination, such as roll-to-roll lamination, coextrusion, calendaring, and the like. Where lamination or rolling is used, the layering is preferably at a temperature less than the melting point of the resin (e.g., about 10° C. less than the melting point). Curing and/or annealing can be carried out before or after layering.

Composites used in circuit materials can be annealed to remove any stresses contained within the films. While annealing can be used, it is believed that the materials formed as described above are low-stress to essentially stress-free in at least the core layer of dielectric substrate without annealing. Advantageously, this can afford circuit materials that are less prone to delamination after exposure to stresses of heat, cold, time, mechanical warping, localized mechanical stress, and electrical stresses.

A further advantageous feature is that the thin dielectric substrates formed using VPI are essentially free of defects such as voids and defects arising from distortion of the web, including tears in the web. Voids as used herein include trapped gas bubbles and unfilled pores and regions. Distortions in the fibrous web during impregnation can lead to thinning of the dielectric substrate. Such defects can provide a pathway for a direct current path (i.e. short circuit) of the dielectric substrate. Using the VPI process, the resin composition is able to uniformly and completely penetrate the interfiber spaces of the fibrous web without significant physical distortion of the web, thereby preventing formation of defects in the impregnated web.

One measure of the low incidence of voids in the dielectric substrate is the uniformity of the dielectric strength of the dielectric substrate. Uniformity of dielectric strength can be determined by measuring the dielectric breakdown voltage at multiple points on a sample, which is done by applying a voltage across two electrodes in intimate contact with surfaces of the dielectric material opposite each other, such that the electrodes are separated by a distance equal to the thickness of the dielectric substrate at the point of measurement. A direct current potential is placed across the electrodes, and the resistance to the voltage flow is measured as the voltage is increased. The voltage at which current begins to flow between the electrodes is noted as the dielectric breakdown voltage, and is measured in megavolts per centimeter (MV/cm). Different dielectric breakdown voltages are associated with different materials of construction, and can vary depending on the compositions of the resin composition including additives, the fibrous web, and the level of contamination in these materials. Contaminants affecting dielectric breakdown voltage can include the level of absorbed moisture, and inorganic contaminants present in the dielectric substrate. Further, the degree of cure of the dielectric substrate can have an effect, with fully cured dielectric substrate having a higher dielectric breakdown voltage. Thickness uniformity affects the dielectric breakdown voltage, with thinner regions showing lower dielectric breakdown voltages. The dielectric strength as measured using dielectric breakdown voltage is substantially uniform where the percentage of data points having a suitable dielectric breakdown voltage are greater than or equal to 95%, specifically greater than or equal to 99%, and more specifically greater than or equal to 99.5% of data points exhibiting suitable dielectric breakdown voltages, per 100 data points measured over a dielectric substrate surface area of 10 $cm^2$.

The presence of defects, including voids, tears, thinned regions, and the like, in the dielectric substrate can also be detected using scanning electron microscopy (SEM). Inspection of SEM images taken of cross-sectional areas of the cured dielectric substrates, at a magnification power of 12.5 KeV. An essentially void-free dielectric substrate comprising the fibrous web and resin composition has fewer than 10 observable voids, specifically fewer than 5 observable voids, more specifically fewer than 1 observable void, per 100 square millimeters of a cross-section of the dielectric substrate. A void, as described herein, is a portion of the dielectric substrate wherein the interfiber spaces are not impregnated with the resin composition (e.g., an air bubble), and has a diameter of greater than about 5 micrometers.

The impregnated LCP fibrous webs are useful as dielectric substrates in circuit laminates. Useful conductive layers for the formation of circuit laminates include stainless steel, copper, aluminum, zinc, iron, transition metals, and alloys comprising at least one of the foregoing, with copper specifically useful. There are no particular limitations regarding the thickness of the conductive layer, nor are there any limitations as to the shape, size or texture of the surface of the conductive layer. The conductive layer has a thickness of about 3 micrometers to about 200 micrometers, specifically about 5 micrometers to about 180 micrometers, and more specifically about 5 micrometers to about 35 micrometers. Where two or more conductive layers are present, the thickness of the two layers can be the same or different.

Copper conductive layers are useful. The copper conductive layer can be treated to increase surface area, treated with a stabilizer to prevent oxidation of the conductive layer (i.e., stain-proofing), or treated to form a thermal barrier. Both low and high roughness copper conductive layers treated with zinc or zinc alloy thermal barriers are particularly useful, and can further optionally comprise a stain-proofing layer. Such copper conductive layers are available from, for example, Oak-Mitsui Inc., Hoosick Falls, N.Y., under the tradename "TOB", Circuit Foil Luxembourg, Granby, Canada, under the tradename "TWS", and Gould Electronics Inc., Chandler, Ariz., under the tradename "JTCS". Other suitable copper conductive layers are available from Yates Foil, Pennsauken, N.J., under the trade name "TAX", from Circuit Foil Luxembourg, Granby, Canada, under the trade name "NT TOR", from Co-Tech Copper Foil Company, Yun Lin, Taiwan, under the trade name "TAX;" and from Changchun Petrochemical Company, Taipei, Taiwan, under the trade name "PINK."

Circuit laminates can be formed using a batch wise or semi-continuous process, wherein at least one layer of the impregnated LCP fibrous web, and any desired additional layers used to form the circuit or multi-layer circuit are arranged in a desired order to form a stack. The stack is then placed in a press, which can or cannot be evacuated to form a vacuum. The temperature is typically increased at a rate of about 2 to about 10° C./minute. Once the temperature reaches the desired lamination temperature the pressure is increased to about 2 to about 3 MegaPascal (MPa). While the desired temperature depends upon the composition of the dielectric composite, the temperature is typically about 200° C. to about 350° C. The stack is held at the desired temperature and pressure for a time sufficient to adhere the layers, about 5 to about 45 minutes. The resulting article is then cooled while maintaining the desired pressure. The article can be removed from the press when the temperature is about 100° C. or lower, and stored until used.

A first embodiment of an exemplary circuit material is shown in FIG. 1, wherein a circuit material 110 comprises conductive layer 114 disposed on a dielectric composite substrate 112. Dielectric substrate 112 comprises a resin composition 116, and a non-woven LCP fibrous web 120. The dielectric substrate 112 can further comprise particulate filler 118. Alternatively, non-woven LCP fibrous web 120 can be substituted with a woven assemblage of fibers (not shown). Conductive layer 114 can be in the form of a circuit layer to form a single clad circuit (not shown).

A second exemplary embodiment is shown in FIG. 2, wherein a double clad circuit laminate 210 comprises a dielectric substrate 212 disposed between two conductive layers 214, 222. Dielectric substrate 212 comprises resin composition 216 and LCP fibrous web 220. The dielectric substrate 212 can further comprise particulate filler (not shown). One or both conductive layers 214, 222 can be in the form of a circuit to form a double clad circuit (not shown).

FIG. 3 depicts an exemplary multi-layer circuit 310 comprising double clad circuits 330, 350. A bond ply 340 is disposed between circuit layers 332, 352. Additionally, a resin coated conductive layer 360 comprising a conductive layer 364 disposed on a flowable dielectric material 366, is disposed on a circuit layer 368 of double clad circuit 330. An additional resin coated conductive layer 370, comprising a flowable dielectric material 372 and a conductive layer 374 is disposed on a circuit layer 376 of double clad circuit 350. Dielectric substrates 378, 380 comprise a resin composition 324, 326 and an LCP non-woven fibrous web 328, 338, and can further comprise a particulate filler 342, 344.

The circuit materials, circuits, and multi-layered circuits manufactured using the dielectric composite described herein have excellent properties, for example good dimensional stability and enhanced reliability, e.g., plated through-hole reliability, and excellent copper peel strength, particularly at high temperature. In particular the dielectric substrates can have a Dk below about 3.45 and a Df of less than about 0.004 when measured at a frequency of 1 to 10 GHz. They can also have good flame retardance, i.e., a rating of V-1 or better as determined by Underwriter's Laboratory procedure UL-94. They can further have good dimensional stability and structural rigidity. The water absorption can be less than 0.05% at a relative humidity of 50%, specifically at a relative humidity of 90%. Copper bond strength at 200° C. can be greater than about 1 pound per linear inch (pli), specifically greater than about 1.2 pli at 200° C. in both the machine and cross machine directions. CTE in the machine direction can be greater than about 0.5 ppm, more specifically greater than about 1 ppm, most specifically greater than about 5 ppm, while CTE in the cross machine direction can be less than about 70 ppm, more specifically less than about 60 ppm, most specifically less than about 50 ppm.

The invention is illustrated by the following non-limiting Examples.

EXAMPLE 1

Fifty feet of a liquid crystalline fibrous web (2.2 mil (56 micrometer) Vecrus), was co-wound at a tension of 1 pound per linear inch (PLI) with a 2 mil thick (51 micrometer) skived polytetrafluoroethylene (PTFE) film to prevent sticking after impregnation. There was a 1/32-inch (0.79 mm) overhang of the PTFE layer at the edges of each roll.

The co-wound roll was placed on its side in a vacuum chamber. The chamber was evacuated for 15 hours to a pressure of 147 microns. The resin reservoir was charged with a 100% solids pre-catalyzed one-component epoxy resin (Erysis F-310) and evacuated. The resin was stirred 5 times during the evacuation, for 15 seconds each time. The resin achieved a final vacuum of 1.4 torr prior to impregnation.

The co-wound roll was heated to 81° F. (27° C.) and the resin was heated to 116.5° F. (47° C.) prior to impregnation, and the resin was transferred to the vacuum chamber holding the roll. After resin transfer, the chamber was pressurized to 100 PSIG and held for 20 hours. The temperature of the resin and roll dropped to 73.6° F. (23° C.) during the 20-hour pressure phase. The roll was B-staged in a rotisserie oven for 75 minutes at 116° C. The resin content of the impregnated fibrous web was 83%. A dielectric breakdown strength of 1601 V/mil was achieved.

EXAMPLE 2

One hundred fifty feet of a liquid crystalline fibrous web (3.3 mil (84 micrometer) Vecrus), was co-wound at a tension of 1 pound per linear inch (PLI) with a 2-mil thick (51 micrometer) skived polytetrafluoroethylene (PTFE) film to prevent sticking after impregnation. There was a 1/32-inch (0.79 mm) overhang of the PTFE layer at the edges of each roll.

The co-wound roll was placed on its side in a vacuum chamber. The chamber was evacuated for 15 hours to a pressure of 147 microns. The resin reservoir was charged with a 100% solids pre-catalyzed one-component epoxy resin (Erysis F-310) and evacuated. The resin was stirred 5 times during the evacuation, for 15 seconds each time. The resin achieved a final vacuum of 1.4 torr prior to impregnation.

The co-wound roll was heated to 81° F. (27° C.) and the resin was heated to 116.5° F. (47° C.) prior to impregnation, and the resin was transferred to the vacuum chamber holding the roll. After resin transfer, the chamber was pressurized to 100 PSIG and held for 20 hours. The temperature of the resin and roll dropped to 73.6° F. (23° C.) during the 20-hour pressure phase. The roll was B-staged in a rotisserie oven for 75 minutes at 116° C. The resin content of the impregnated fibrous web was 73%. A dielectric breakdown strength of 850 V/mil was achieved.

EXAMPLE 3

One hundred fifty feet of a liquid crystalline fibrous web (5.5 mil (140 micrometer) Vecrus), was co-wound at a tension of 0.5 pound per linear inch (PLI) with a 2-mil thick (51 micrometer) skived polytetrafluoroethylene (PTFE) film to prevent sticking after impregnation. There was a 1/32-inch (0.79 mm) overhang of the PTFE layer at the edges of each roll.

The co-wound roll was placed on its side in a vacuum chamber. The chamber was evacuated for 15 hours to a pressure of 147 microns. The resin reservoir was charged with a 100% solids pre-catalyzed one-component epoxy resin (Erysis F-310) and evacuated. The resin was stirred 5 times during the evacuation, for 15 seconds each time. The resin achieved a final vacuum of 1.4 torr prior to impregnation.

The co-wound roll was heated to 81° F. (27° C.) and the resin was heated to 116.5° F. (47° C.) prior to impregnation, and the resin was transferred to the vacuum chamber holding the roll. After resin transfer, the chamber was pressurized to 100 PSIG and held for 20 hours. The temperature of the resin and roll dropped to 73.6° F. (23° C.) during the 20-hour pressure phase. The roll was B-staged in a rotisserie oven for 60 minutes at 107° C., followed by 105 minutes at 121° C. The resin content of the impregnated fibrous web was 72%. A dielectric breakdown strength of 1860 V/mil was achieved.

EXAMPLE 4

The co-wound roll of Example 3, co-wound at a tension of 1 PLI, was treated by vacuum-pressure impregnation as in Example 3.

The roll was B-staged for 75 minutes at 116° C., followed by 60 minutes at 150° F. (65.6° C.). The resin content of the impregnated fibrous web was 73%. A dielectric breakdown strength of 1203 V/mil was achieved.

EXAMPLE 5

The co-wound roll of Example 3, co-wound at a tension of 1.5 PLI, was treated by vacuum-pressure impregnation as in Example 3.

The roll was B-staged for 75 min at 116° C. The resin content of the impregnated fibrous web was 75%. Dielectric breakdown strengths of up to 2431 V/mil were achieved.

EXAMPLE 6

One hundred fifty feet of a 106-style glass fibrous web was co-wound at a tension of 1 pound per linear inch (PLI) with a 2-mil thick (51 micrometer) skived polytetrafluoroethylene (PTFE) film to prevent sticking after impregnation. There was a 1/32-inch (0.79 mm) overhang of the PTFE layer at the edges of each roll.

The co-wound roll was vacuum impregnated as described in Example 1. The temperature of the resin and roll dropped to 73.6° F. (23° C.) during the 20-hour pressure phase. The roll was B-staged for 60 minutes at 116° C. followed by 60 min at 150° F. (65.6° C.). The resin content of the roll was 63%. A dielectric breakdown strength of 1755 V/mil was achieved.

EXAMPLE 6

One hundred fifty feet of 1080 glass fibrous web was co-wound at a tension of 1 pound per linear inch (PLI) with a 2-mil thick (51 micrometer) skived polytetrafluoroethylene (PTFE) film to prevent sticking after impregnation. There was a 1/32-inch (0.79 mm) overhang of the PTFE layer at the edges of each roll.

The co-wound roll was vacuum impregnated as described in Example 1. The temperature of the resin and roll dropped to 73.6° F. (23° C.) during the 20-hour pressure phase.

The roll was B-staged for 60 minutes at 107° C., followed by 105 minutes at 121° C. The resin content of the roll was 54%. A dielectric breakdown strength of 2035 V/mil was achieved.

The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A method of forming a composite, comprising
   in a vacuum chamber, contacting a liquid crystalline polymer fibrous web having interfiber spaces and a thickness of less than or equal to about 5 mils (127 micrometers), co-wound with a carrier, with a resin composition that is substantially free of a solvent, in the presence of a vacuum effective to infiltrate the fibrous web with the resin composition to provide an infiltrated, co-wound liquid crystalline polymer fibrous web;
   removing the vacuum; and
   in the vacuum chamber, applying greater than atmospheric pressure to the infiltrated fibrous web to provide an impregnated liquid crystalline polymer fibrous web.

2. The method of claim 1 wherein the liquid crystalline polymer web comprises liquid crystalline polymer fibers and a binder.

3. The method of claim 1 wherein the liquid crystalline polymer fibrous web is non-woven.

4. The method of claim 1 wherein the liquid crystalline polymer fibrous web is a woven fabric.

5. The method of claim 1 wherein the carrier is porous.

6. The method of claim 1 wherein the resin composition comprises a thermosetting resin, a thermoplastic resin, or a combination comprising at least one of the foregoing resins.

7. The method of claim 6 wherein the resin composition comprises an epoxy resin, a polybutadiene, a polyisoprene, a polyester, a polyimide, a silicone, a bismaleimide triazine, a benzoxazine, a polystyrene, a poly(methacrylate), a polyacrylate, a poly(arylene ether), a polyaryletherketone, or a combination comprising at least one of the foregoing resins.

8. The method of claim 1, wherein the resin composition comprises a curable epoxy resin.

9. The method of claim 1, wherein the resin composition comprises a particulate filler dispersed in the resin composition.

10. The method of claim 1, further comprising dispersing a particulate filler onto the liquid crystalline polymer web prior to contacting with the resin composition.

11. The method of claim 1, further comprising dispersing a particulate filler onto the carrier prior to contacting liquid crystalline polymer web with the resin composition.

12. The method of claim 1, wherein the resin composition is a thermosetting resin composition, the method further comprising partially or fully curing the thermosetting resin composition in the impregnated liquid crystalline polymer fibrous web.

13. The method of claim 1, further comprising contacting the impregnated liquid crystalline polymer fibrous web with a conductive layer.

14. The method of claim 13, wherein the contacting is by lamination.

15. The method of claim 1 wherein the carrier is made from a material having low adhesion to the infiltrated web.

* * * * *